US012369400B2

(12) United States Patent
Tseng et al.

(10) Patent No.: US 12,369,400 B2
(45) Date of Patent: Jul. 22, 2025

(54) ELECTRONIC DEVICE

(71) Applicant: InnoLux Corporation, Miao-Li County (TW)

(72) Inventors: Yu-Chih Tseng, Miao-Li County (TW); Yi Tung, Miao-Li County (TW); Pi-Ying Chuang, Miao-Li County (TW); Kuo-Shun Tsai, Miao-Li County (TW); Chu-Hong Lai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 233 days.

(21) Appl. No.: 17/989,653

(22) Filed: Nov. 17, 2022

(65) Prior Publication Data

US 2023/0197733 A1 Jun. 22, 2023

(30) Foreign Application Priority Data

Dec. 21, 2021 (CN) .......................... 202111572205.3

(51) Int. Cl.
| | |
|---|---|
| *G02F 1/1345* | (2006.01) |
| *G02F 1/1335* | (2006.01) |
| *G02F 1/1362* | (2006.01) |
| *H10D 86/40* | (2025.01) |
| *H10D 86/60* | (2025.01) |
| *G02F 1/1333* | (2006.01) |
| *G02F 1/1339* | (2006.01) |
| *G02F 1/1368* | (2006.01) |

(52) U.S. Cl.
CPC ....... *H10D 86/60* (2025.01); *G02F 1/133528* (2013.01); *G02F 1/13458* (2013.01); *G02F 1/136286* (2013.01); *H10D 86/441* (2025.01); *G02F 1/133305* (2013.01); *G02F 1/1339* (2013.01); *G02F 1/1368* (2013.01); *G02F 2201/56* (2013.01); *G02F 2202/28* (2013.01)

(58) Field of Classification Search
CPC ............. H01L 27/124; G02F 1/133528; G02F 1/13458; G02F 1/136286; G02F 1/133305; G02F 1/1339; G02F 1/1368; G02F 2201/56; G02F 2202/28; H10D 86/60; H10D 86/441
See application file for complete search history.

(56) References Cited

U.S. PATENT DOCUMENTS

| | | | |
|---|---|---|---|
| 6,437,846 B1 * | 8/2002 | Ono | ................... G02F 1/13452 349/149 |
| 2011/0051068 A1 * | 3/2011 | Kamon | ................ H05K 3/4046 174/254 |
| 2014/0254111 A1 | 9/2014 | Yamazaki | |

FOREIGN PATENT DOCUMENTS

TW I515481 B 1/2016

* cited by examiner

*Primary Examiner* — James A Dudek
(74) *Attorney, Agent, or Firm* — Winston Hsu

(57) ABSTRACT

An electronic device includes a panel with an operation region and an extended circuit region. The panel includes a first substrate and a first polarizing element. The first polarizing element is disposed on the first substrate. The first substrate extends from the operation region to the extended circuit region, and the first polarizing element extends from the operation region to the extended circuit region.

8 Claims, 8 Drawing Sheets

ELECTRONIC DEVICE

BACKGROUND OF THE DISCLOSURE

1. Field of the Disclosure

The present disclosure relates to an electronic device, in particular is directed to an electronic device with an extended circuit region.

2. Description of the Prior Art

With the development of science and technology, electronic devices are widely used in various fields of daily life. How to improve the quality of electronic devices, to reduce manufacturing costs or to simplify the manufacturing process has become an important issue.

SUMMARY OF THE DISCLOSURE

An electronic device of the present disclosure includes an operation region and a panel with an extended circuit region. The panel includes a first substrate and a first polarizing element. The first polarizing element is disposed on the first substrate. The first substrate extends from the operation region to the extended circuit region, and the first polarizing element extends from the operation region to the extended circuit region.

These and other objectives of the present disclosure will no doubt become obvious to those of ordinary skill in the art after reading the following detailed description of the embodiment that is illustrated in the various figures and drawings.

Figure 1:
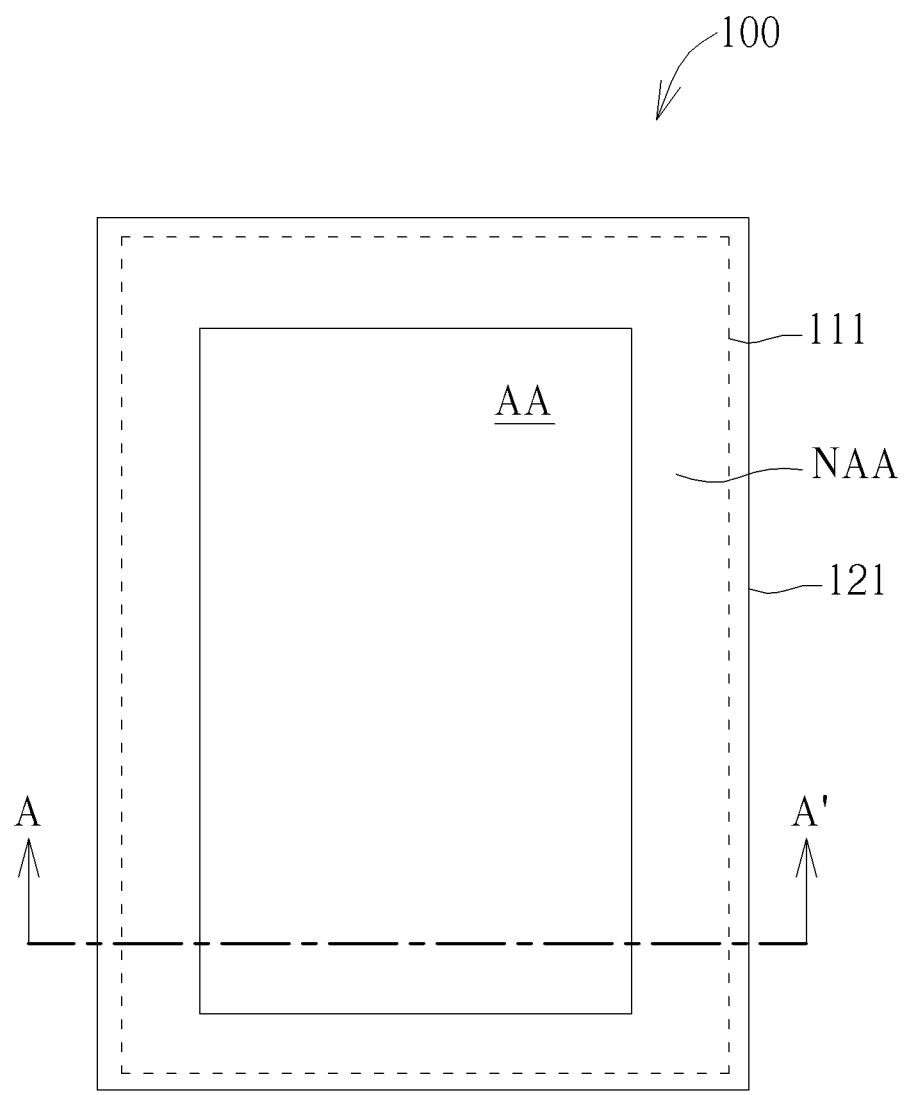
FIG. 1 to FIG. 4 illustrate schematic top views of a method of fabricating an electronic device according to the present disclosure of different processes.
Figure 1:
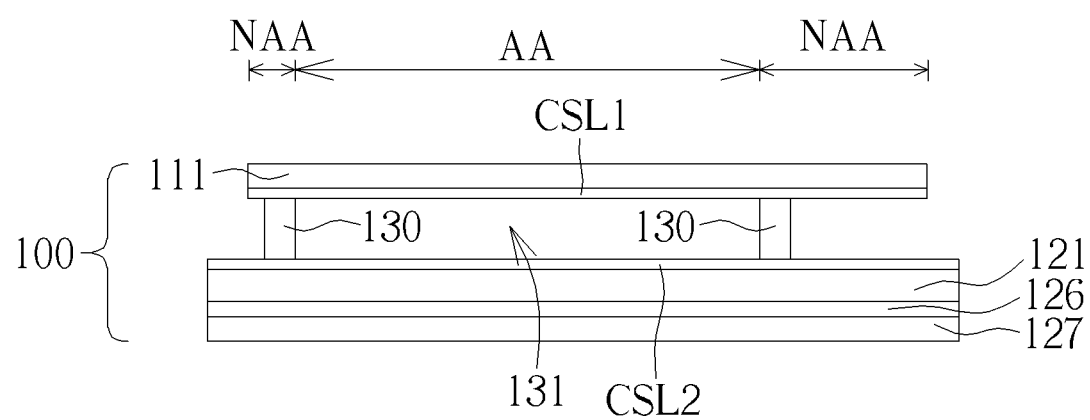

The bottom of FIG. 1 illustrates a schematic cross-sectional structure view along the line A-A' in FIG. 1.

Figure 2:
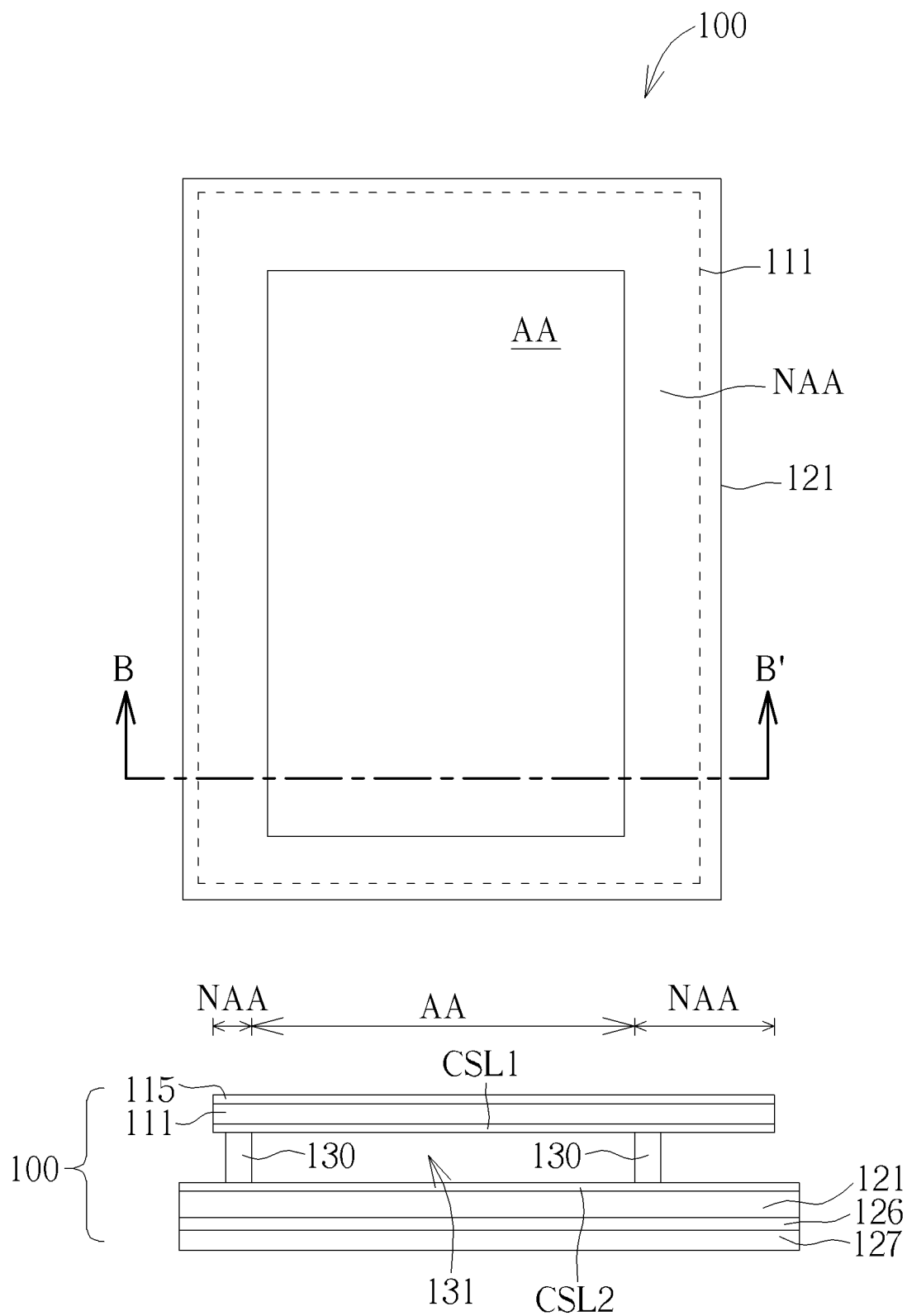

The bottom of FIG. 2 illustrates a schematic cross-sectional structure view along the line B-B' in FIG. 2.

Figure 3:
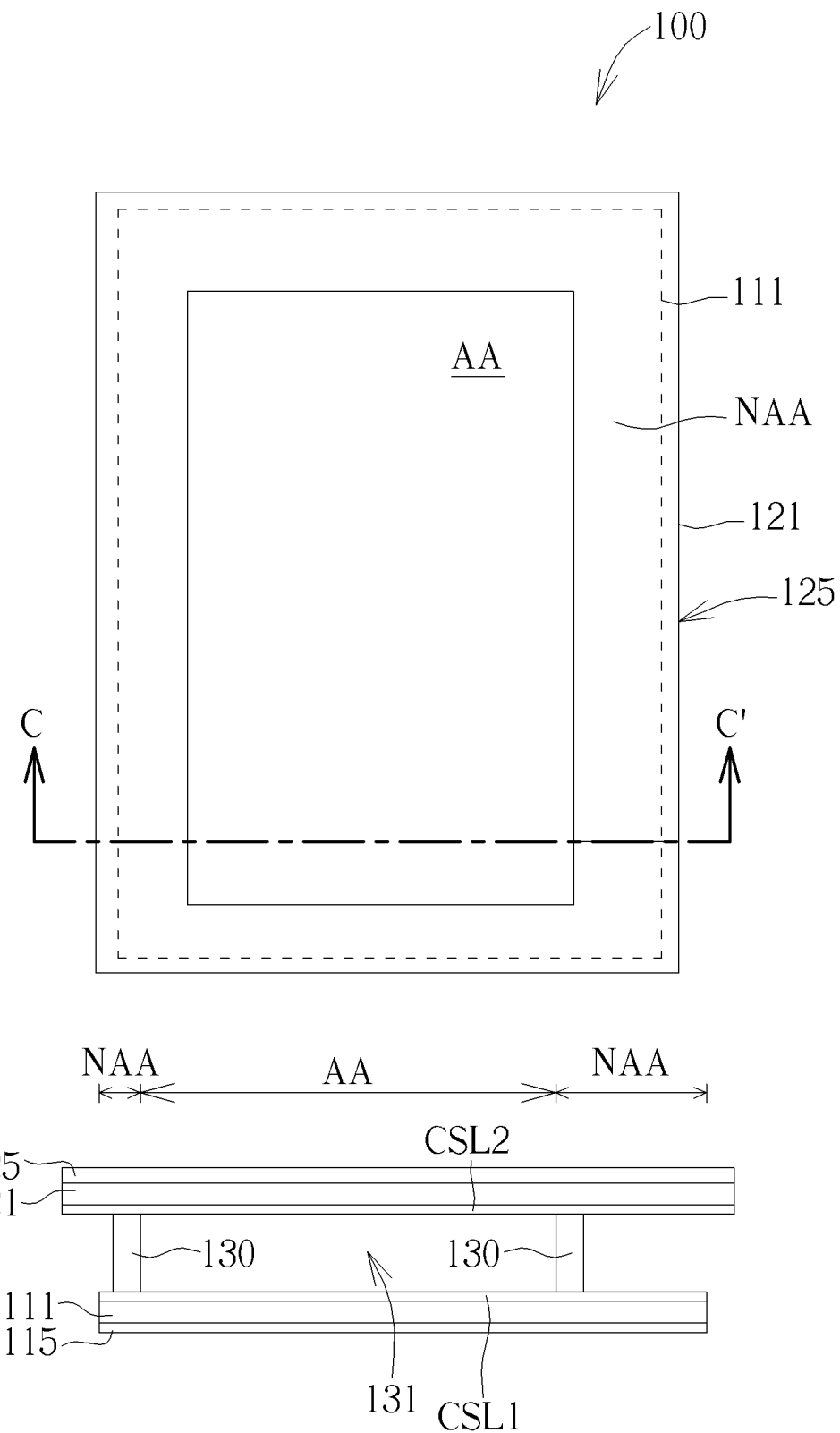

The bottom of FIG. 3 illustrates a schematic cross-sectional structure view along the line C-C' in FIG. 3.

Figure 4:
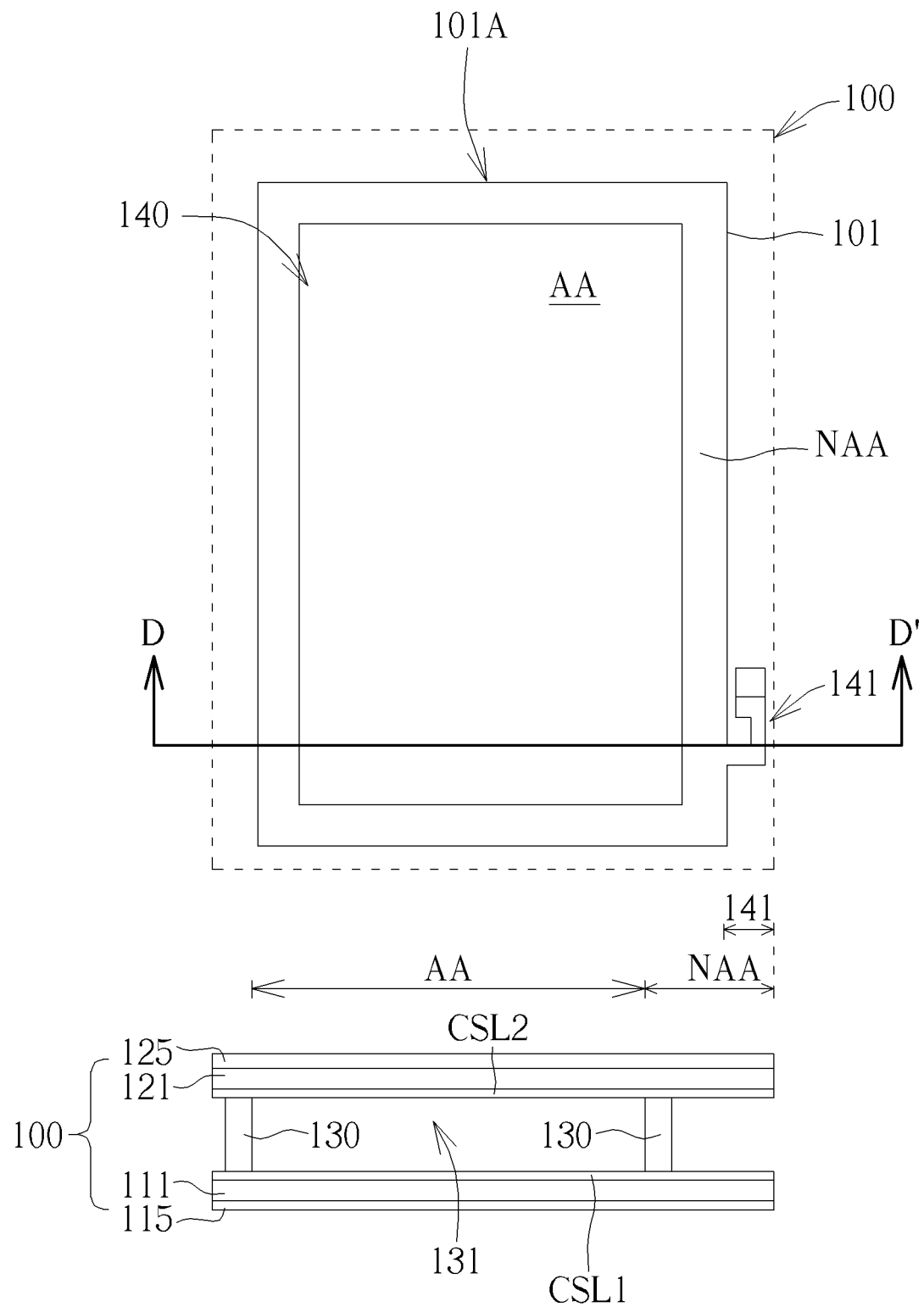

The bottom of FIG. 4 illustrates a schematic cross-sectional structure view along the line D-D' in FIG. 4.

Figure 5:
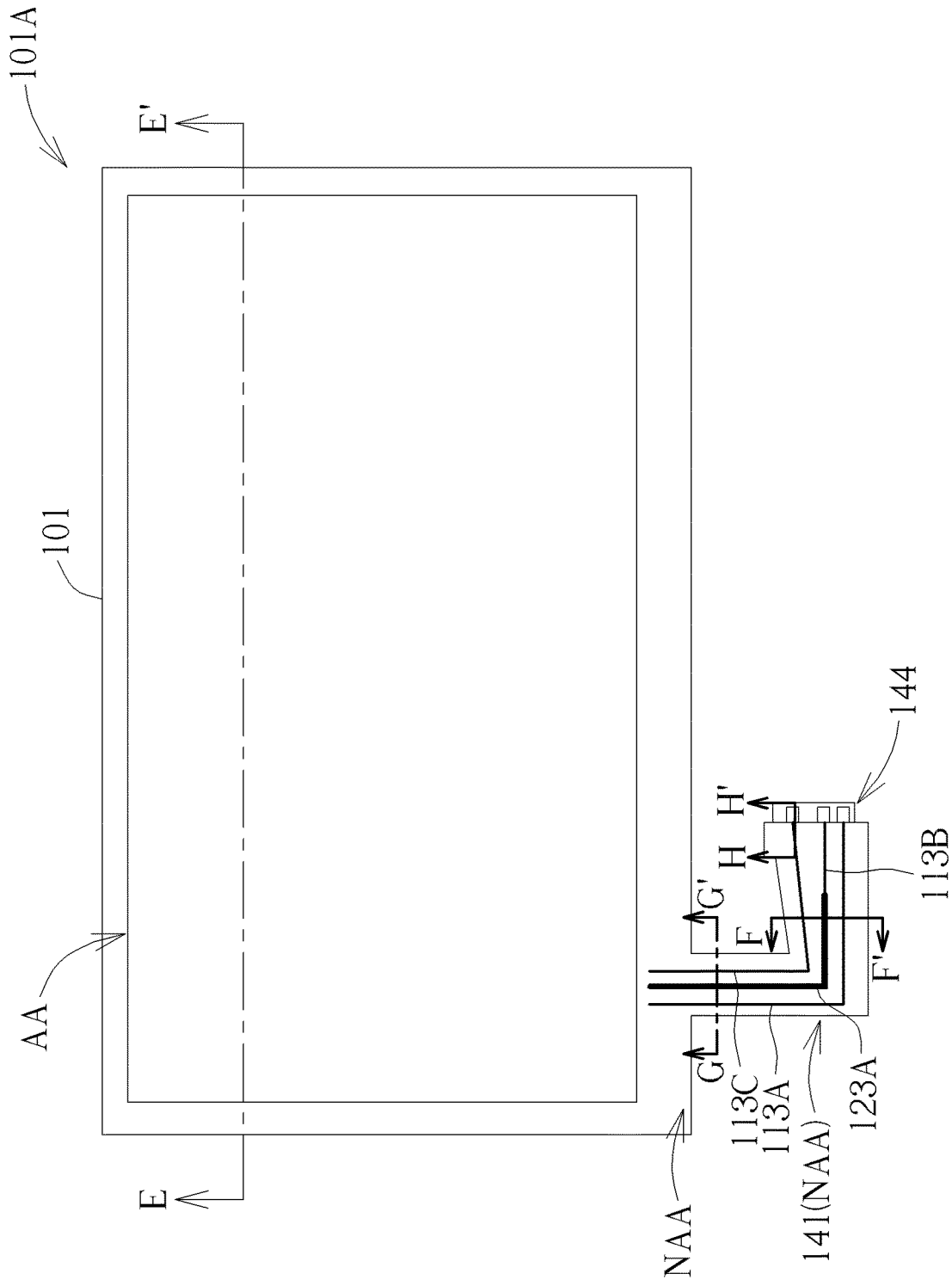

FIG. 5 illustrates a schematic top view of an electronic device according to some embodiments of the present disclosure.

Figure 6:
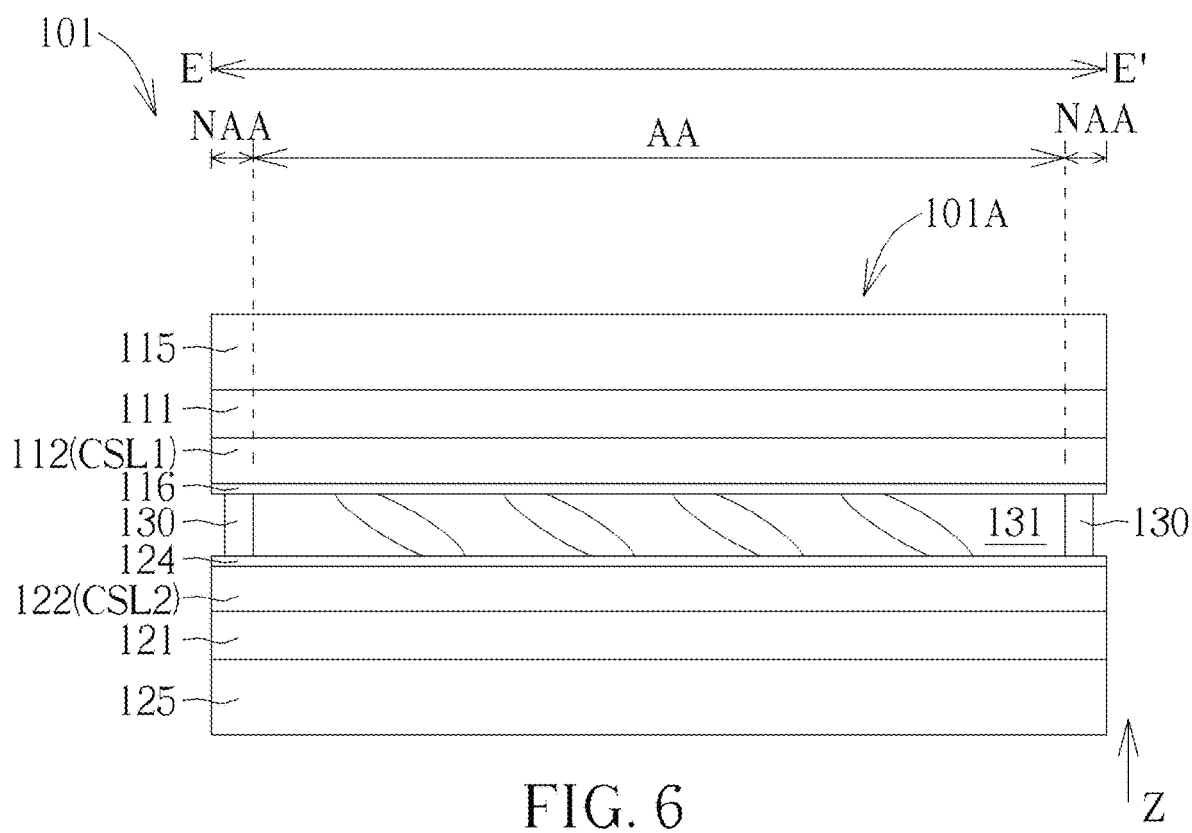

FIG. 6 illustrates a schematic cross-sectional structure view of the electronic device along the line E-E' in FIG. 5 according to an embodiment of the present disclosure.

Figure 7:
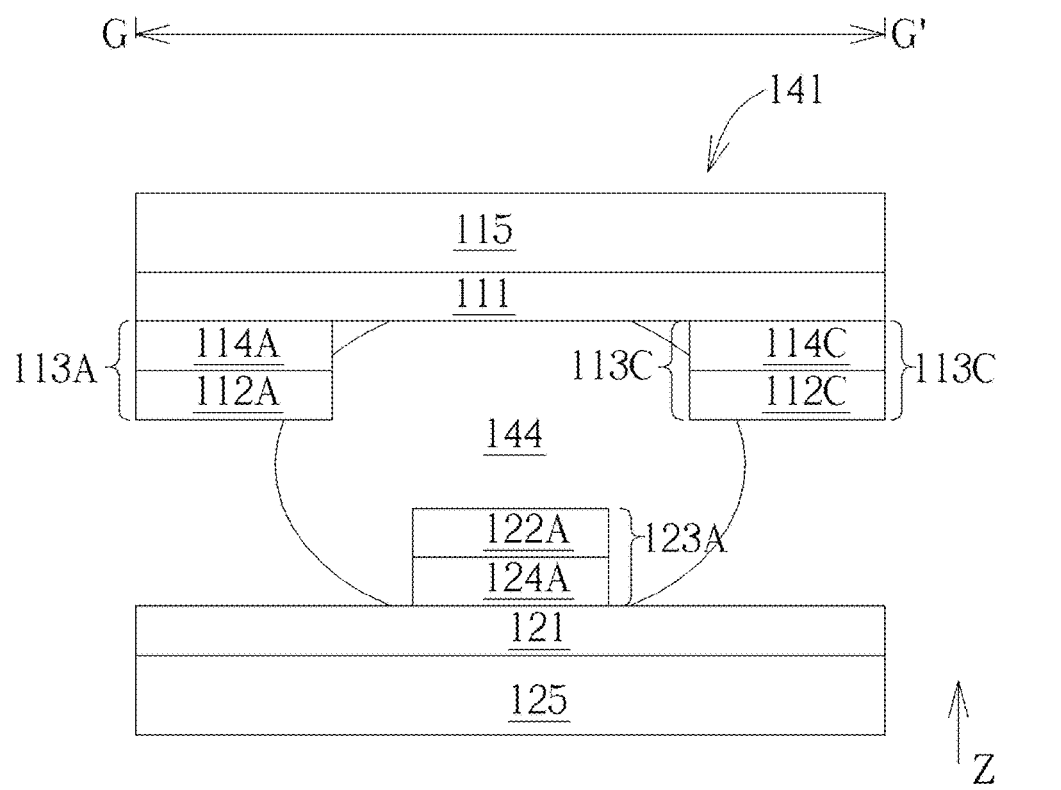

FIG. 7 illustrates a schematic cross-sectional structure view of the electronic device along the line G-G' in FIG. 5 according to an embodiment of the present disclosure.

Figure 8:
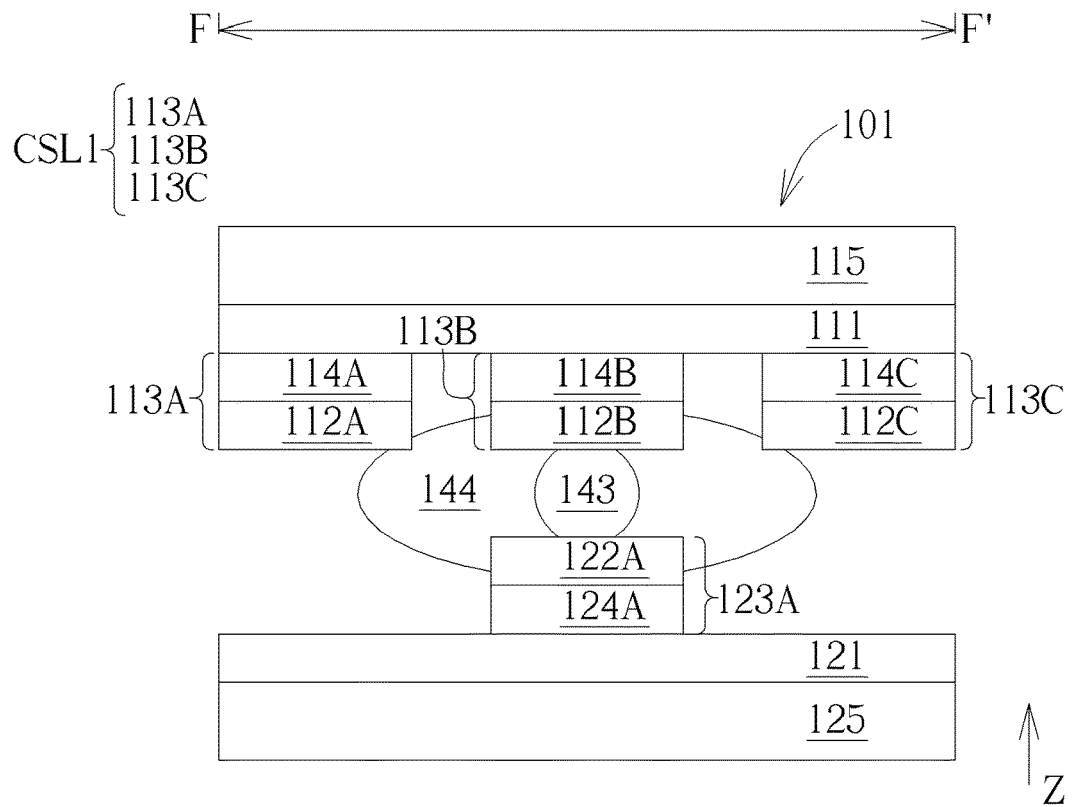

FIG. 8 illustrates a schematic cross-sectional structure view of the electronic device along the line F-F' in FIG. 5 according to an embodiment of the present disclosure.

Figure 9:
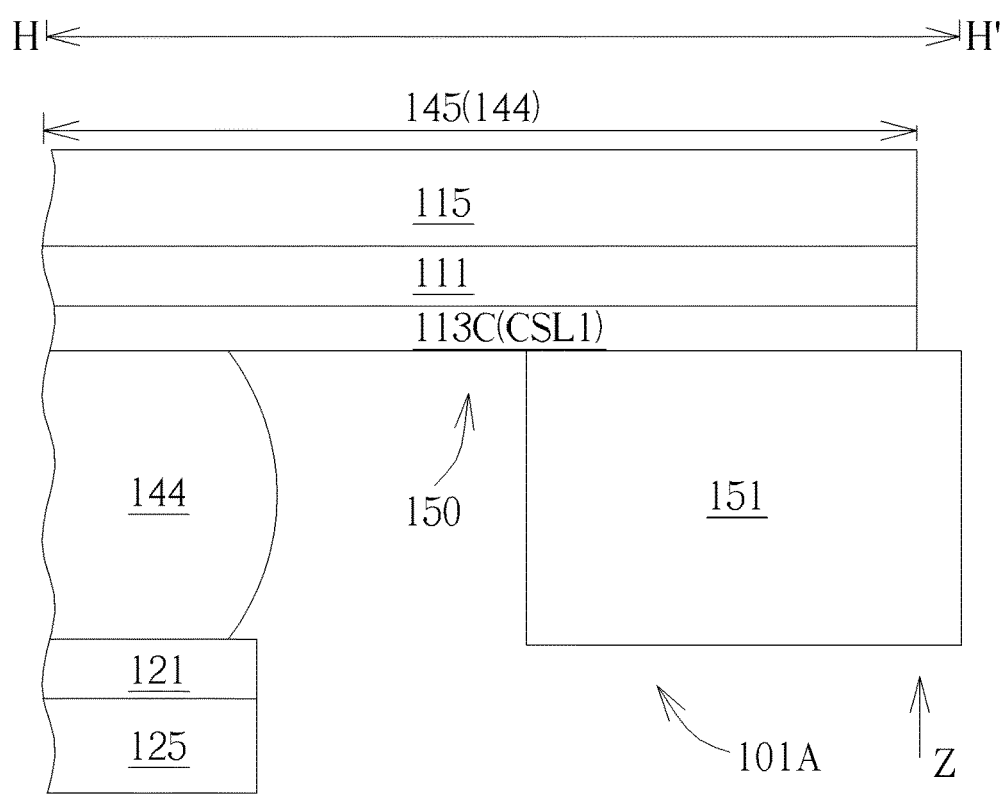

FIG. 9 illustrates a schematic cross-sectional structure view of the electronic device along the line H-H' in FIG. 5 according to an embodiment of the present disclosure.

Figure 10:
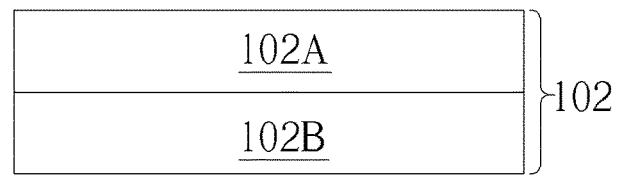

FIG. 10 illustrates a schematic side view of an electronic device according to an embodiment of the present disclosure.

Figure 11:
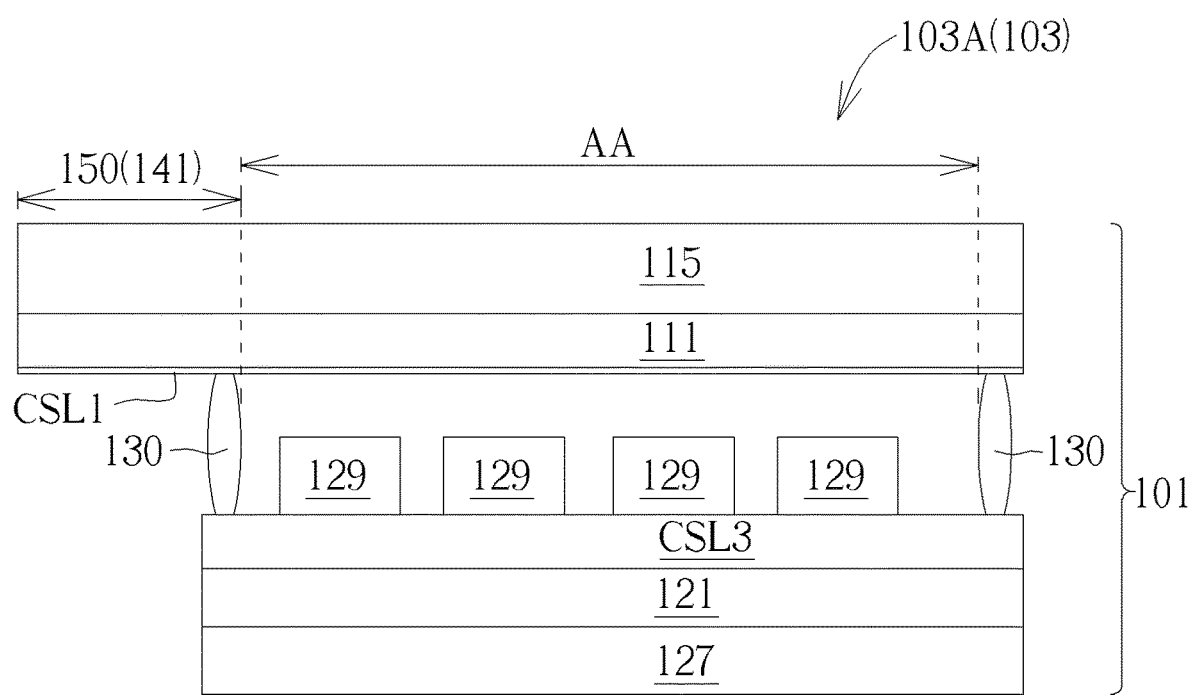

FIG. 11 illustrates a schematic cross-sectional structure view of the electronic device along the line E-E' in FIG. 5 of a variant embodiment according to an embodiment of the present disclosure.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function.

In the following description and in the claims, the terms "include", "comprise" and "have" are used in an open-ended fashion, and thus should be interpreted to mean "include, but not limited to . . . ".

It will be understood that when an element or layer is referred to as being "on another component or on another layer" or "connected to another component or to another layer", it can be directly on or directly connected to the other element or layer, or intervening elements or layers may be presented. In contrast, when an element is referred to as being "directly on" or "directly connected to" another element or layer, there are no intervening elements or layers presented.

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

In some embodiments of the present disclosure, terms such as "connection", "electrically connected to", etc. regarding bonding and electrical connection, unless specifically defined, may refer to two structures which are in direct contact with each other, or are not in direct contact with each other. In case of direct connection, the endpoints of the elements on the two circuits are directly connected or connected to each other by a conductor segment, and in the case of indirect connection, there are a switch, a diode, a capacitor, an inductor, a resistor, other suitable devices, or a combination of the above, disposed between the endpoints of the elements on the two circuits, but it is not limited thereto.

In the present disclosure, the measurement methods of thickness, length and width may be measured by an optical microscope, and the thickness or width may be measured by a cross-sectional image in an electron microscope, but the present disclosure is not limited thereto. In addition, any two values or directions used for comparison may have certain errors. Additionally, references to the terms "equal to," "equal," "same," "substantially," or "substantially" throughout this disclosure generally mean within 10% of a given value or range. Furthermore, the terms "a given range is from a first value to a second value", "a given range is within a range from the first value to the second value" means that the given range includes the first value, the second value and the other values lie in between. If the first direction is perpendicular to the second direction, the angle between the first direction and the second direction may be between 80 degrees and 100 degrees; if the first direction is parallel to the second direction, the angle between the first direction and the second direction may be between 0 and 10 degrees.

Unless otherwise defined, all terms (including technical and scientific terms) used herein have the same meaning as commonly understood by one of ordinary skill in the art to which this disclosure pertains. It should be understood that these terms, such as those defined in commonly used dictionaries, should be interpreted as having meanings consistent with the relevant art and the background or context of the present disclosure, and should not be interpreted in an idealized way or overly formal manner unless they are otherwise defined in the embodiments of the present disclosure.

In the present disclosure, an electronic device may include a display device, a backlight device, an antenna device, a sensing device or a splicing device, but it is not limited thereto. The electronic device may be a bendable or flexible electronic device. The display device may be a non-self-luminous display device or a self-luminous display device. The antenna device may be a liquid crystal type antenna device or a non-liquid crystal antenna type device, and the sensing device may be a sensing device for sensing capacitance, light, heat or ultrasonic waves, but it is not limited thereto. In the present disclosure, an electronic element may include a passive component and an active component, such as a capacitor, a resistor, an inductor, a diode, a transistor, and the like. The diode may include a light-emitting diode or a photodiode. A light-emitting diode may, for example, include an organic light emitting diode (OLED), a sub-millimeter light emitting diode (mini LEDs), a micro LED, or a quantum dot LED, but it is not limited thereto. The splicing device may be, for example, a display splicing device or an antenna splicing device, but it is not limited thereto. It should be noted that, the electronic device may be any arrangement and combinations of the above, but it is not limited thereto. Hereinafter, the present disclosure will be described by using the display device as the electronic device or the splicing device, but the present disclosure is not limited thereto.

It should be noted that the technical solutions provided by the different embodiments hereinafter may be replaced, combined or mixed, so as to constitute another embodiment without violating the spirit of the present disclosure.

FIG. 1 to FIG. 4 illustrate schematic top views of a method of fabricating an electronic device according to the present disclosure of different processes. The bottom of FIG. 1 illustrates a schematic cross-sectional structure view along the line A-A' in FIG. 1, the bottom of FIG. 2 illustrates a schematic cross-sectional structure view along the line B-B' in FIG. 2, the bottom of FIG. 3 illustrates a schematic cross-sectional structure view along the line C-C' in FIG. 3, and the bottom of FIG. 4 illustrates a schematic cross-sectional structure view along the line D-D' in FIG. 4.

First, please refer to FIG. 1, according to the method of fabricating an electronic device of the present disclosure, an initial panel 100 may be provided. The initial panel 100 may be, for example, a paired panel without being cut, but the present disclosure is not limited thereto. In detail, the initial panel 100 may include a first substrate 111, a second substrate 121 and a sealing material 130, and the second substrate 121 is disposed relative to the first substrate 111, but the present disclosure is not limited thereto. A color filter layer (not shown) may be disposed on the first substrate 111, a thin film transistor (not shown) may be disposed on the second substrate 121, and vice versa, but the present disclosure is not limited thereto. The first substrate 111 and the second substrate 121 may be paired to form the initial panel 100, but the present disclosure is not limited thereto.

In some embodiments, the first conductive line structure CSL1 may be disposed on a surface of the first substrate 111 adjacent to the second substrate 121. In some embodiments, the second conductive line structure CSL2 may be disposed on a surface of the second substrate 112 adjacent to the first substrate 111.

In some embodiments, a carrier 127 may be disposed on a surface of the second substrate 121 away from the first substrate 111. The carrier 127 may include a hard carrier, such as glass or ceramic, for temporarily supporting the second substrate 121. In some embodiments, a sacrificial layer 126 may be disposed between the carrier 127 and the second substrate 121, but the present disclosure is not limited thereto. The sacrificial layer 126 may be selectively removed in a subsequent process, thereby separating the carrier 127 from the second substrate 121. The first substrate 111 and/or the second substrate 121 may include a flexible substrate material, such as polyimide (PI) or other suitable materials, but the present disclosure is not limited thereto.

FIG. 1 illustrates an embodiment in which the size of the second substrate 121 may be different from the size (for example, an area) of the first substrate 111. For example, the size of the second substrate 121 may be larger than the size (for example, an area) of the first substrate 111, but the present disclosure is not limited thereto. In some embodiments, the shape or size (for example, an area) of the second substrate 121 may be the same or different from the shape or size (for example, an area) of the first substrate 111.

In some embodiments, the initial panel 100 may include a medium material 131, and the medium material 131 may be disposed between the first substrate 111 and the second substrate 121. The medium material 131 may be, for example, a light-modulating material, such as a liquid crystal material or other suitable materials. In some embodiments, the sealing material 130 may be disposed between the first substrate 111 and the second substrate 121 to surround the periphery of the medium material 131. In some embodiments, the sealing material 130 may include an adhesive material, a fiber material, other suitable materials, or a combination thereof. In some embodiments, an operation region AA (or an active area) and a non-operation region NAA may be roughly defined according to the sealing material 130 when the initial panel 100 includes the sealing material 130, but the present disclosure is not limited thereto. The operation region AA may be defined as a region which is surrounded by the sealing material 130. In other embodiments (not shown), the operation region AA may be defined according to the application types of the panel (for example, display, detection, light-emitting, or other applications) when the initial panel 100 does not include the sealing material 130. For example, the operation region AA may be roughly defined as a region which is capable of displaying images, and so on when the panel is a display panel. In addition, the region in the initial panel 100 which excludes the operation region AA may be regarded as the non-operation region AA.

Please refer to FIG. 2. The first polarizing element 115 is disposed on the first substrate 111, for example, the first polarizing element 115 is disposed on a surface of the first substrate 111 away from the second substrate 121. In some embodiments, the shape or size (for example, an area) of the first polarizing element 115 may be substantially the same as the shape or size (for example, an area) of the first substrate 111, but the present disclosure is not limited thereto. In some embodiments, the first substrate 111 and/or the first polarizing element 115 may extend from the operation region AA to the non-operation region NAA (including the extended circuit region formed by the subsequent cutting).

Then, please refer to FIG. 3, in some embodiments, the sacrificial layer 126 and the carrier 127 may be removed before the second polarizing element 125 is disposed on the second substrate 121. Then, the second polarizing element 125 is disposed on a surface of the second substrate 121 away from the first substrate 111. In some embodiments, the shape or size (for example, an area) of the second polarizing element 125 may be substantially the same as the shape or size (for example, an area) of the second substrate 121, but the present disclosure is not limited thereto. In some embodiments, the second substrate 121 and/or the second polarizing element 125 extends from the operation region AA to the non-operation region NAA (including the extended circuit region formed by the subsequent cutting).

Then, please refer to FIG. 4, a cutting process with respect to the initial panel 100 is carried out to obtain the panel 101 of the electronic device. The cutting process may include cutting off a portion of the non-operation region NAA of the initial panel 100 (the dotted lines in FIG. 4 indicates the cut-off portion of the non-operation region NAA), to retain a portion of the non-operation region NAA and the complete operation region AA. In other words, the panel 101 which is obtained after the cutting may include at least the first substrate 111, the second substrate 121, the first polarizing element 115 and/or the second polarizing element 125 located in the operation region AA, but the present disclosure is not limited thereto. The panel 101 which is obtained after the cutting may further include the first substrate 111, the second substrate 121, the first polarizing element 115 and/or the second polarizing element 125 and/or the sealing material 130 which are partially located in the non-operation region NAA. In some embodiments, the retained non-operation region NAA may include at least one extended circuit region 141. FIG. 4 illustrates an embodiment in which the panel 101 includes one single extended circuit region 141, but the present disclosure is not limited thereto. In some embodiments, the extended circuit region 141 may be, for example, connected to at least one side of the operation region AA, and portions of other non-operation regions NAA may be selectively disposed between the operation region AA and the extended circuit region 141. In some embodiments, the outline of the extended circuit region 141 may be, for example, in the form of an L-shape or other suitable shapes (for example, rectangle), but the present disclosure is not limited thereto. In other words, the panel 101 which is obtained after the cutting may have the operation region AA and the extended circuit region 141, and the panel 101 includes the first substrate 111 and the first polarizing element 115 with the first polarizing element 115 which is disposed on the first substrate 111. In some embodiments, the first substrate 111 may extend from the operation region AA to the extended circuit region 141, and the first polarizing element 115 may extend from the operation region AA to the extended circuit region 141. In some embodiments, the panel 101 includes a second substrate 121 and a second polarizing element 125. The second substrate 121 is disposed relative to the first substrate 111 and extends from the operation region AA to the extended circuit region 141. The second polarizing element 125 may be disposed on a surface of the second substrate 121 away from the first substrate 111, and the second polarizing element 125 extends from the operation region AA to the extended circuit region 141. The panel 101 may be a privacy control panel or a display panel, but the present disclosure is not limited thereto.

Please refer to FIG. 5, a schematic top view of an electronic device 101A according to some embodiments of the present disclosure is shown. The electronic device 101A includes a panel 101, and the panel 101 has an operation region AA and one or more extended circuit regions 141. As described above, the operation region 140 may generally be defined as the region which is surrounded by the sealing material 130 when the panel 101 includes the sealing material 130, but the present disclosure is not limited thereto. In some embodiments, a plurality of sub-pixels or thin film transistors (not shown) may be located in the operation region AA. In some embodiments, the non-operation region NAA which is retained after the panel 101 is cut may be disposed at least one side of the operation region AA, but it is not limited thereto. In some embodiments, some circuits may be selectively disposed in the above-mentioned retained non-operation region NAA, but the present disclosure is not limited thereto.

FIG. 6 illustrates a schematic cross-sectional structure view of the electronic device 101A along the line E-E' in FIG. 5 according to an embodiment of the present disclosure. Please refer to FIG. 5 and FIG. 6, the panel 101 may include a first substrate 111, a second substrate 121, a sealing material 130, a medium material 131, a first polarizing element 115 and a second polarizing element 125. Please refer to the above descriptions for the detailed arrangements and relationship of these elements. In some embodiments, the first conductive line structure CSL1 may be disposed on a surface of the first substrate 111 away from the first polarizing element 115. In some embodiments, the second conductive line structure CSL2 may be disposed on a surface of the second substrate 121 away from the second polarizing element 125. In some embodiments, the panel 101 may include a first alignment film 116 and/or a second alignment film 124. In some embodiments, the first alignment film 116 may be disposed on a surface of the first conductive line structure CSL1 adjacent to the medium material 131. In some embodiments, the second alignment film 124 may be disposed on a surface of the second conductive line structure CSL2 adjacent to the medium material 131. In other words, the medium material 131 may be disposed between the first alignment film 116 and the second alignment film 124. In some embodiments, the first conductive line structure CSL1 may include a first conductive layer 112, and the first conductive layer 112 may serve as a first electrode. In some embodiments, the second conductive line structure CSL2 may include a second conductive layer 122, and the second conductive layer 122 may serve as a second electrode. In some embodiments, the first conductive layer 112 and/or the second conductive layer 122 may be, for example, at least disposed in the operation region AA. In some embodiments, the first conductive layer 112 and/or the second conductive layer 122 may be, for example, an entire piece of electrodes, but the present disclosure is not limited thereto. In some embodiments, the first conductive layer 112 and the second conductive layer 122 may substantially overlap in the normal direction Z of the first substrate 111, but the present disclosure is not limited thereto. In some embodiments (not shown), the first conductive layer 112 and/or the second conductive layer 122 may be, for example, patterned electrodes. In some embodiments, the first conductive layer 112 and/or the second conductive layer 122 may include a transparent conductive material or a non-transparent conductive material, but the present disclosure is not limited thereto. The transparent conductive material includes, for example, a metal oxide, a nano-silver wire or a nano-conductive metal, other suitable materials, or a combination of the above, but the present disclosure is not limited thereto. In some embodiments, the materials of the second conductive layer 122 may be similar to these of the first conductive layer 112, but the present disclosure is not limited thereto. In some embodiments, the first conductive layer 112 and the second conductive layer 122 may be a single layer or a composite layer of materials. In some embodiments, one of the first conductive line structure CSL1 or the second conductive line structure CSL2 may selectively include a thin film transistor.

FIG. 7 illustrates a schematic cross-sectional structure view of the electronic device 101A along the line G-G' in FIG. 5 according to an embodiment of the present disclosure. Please refer to FIG. 5 and FIG. 7, the first conductive line structure CSL1 may have one or more first traces (for example, 113A/113C) which are disposed in the extended circuit region 141, but the present disclosure is not limited thereto. In some embodiments, the second conductive line structure 123 may have one or more second traces 123A which are disposed in the extended circuit region 141. In some embodiments, the number of the first traces may be the same as or different from the number of the second traces. FIG. 7 illustrates an example of a single second trace 123A, but the present disclosure is not limited thereto. In some embodiments, the first traces (for example, 113A/113C) and/or the second traces 123A may, for example, include a metal material, a transparent conductive material, or a combination of the above. In some embodiments, the first traces (for example, 113A/113C) are, for example, a single-layer or multi-layer structure. In some embodiments, the second trace 123A is, for example, a single-layer or multi-layer structure. For example, the first traces (for example, 113A/113C) may be composed of, for example, a first conductive pattern (112A/112C) and/or a second conductive pattern (114A/114C), respectively. For example, the second trace 123A may be, for instance, composed of a third conductive pattern 124A and/or a fourth conductive pattern 122A, but the present disclosure is not limited thereto. In some embodiments, the first traces (for example, 113A/113C) and the second traces 123A do not overlap, for example, in the normal direction Z of the first substrate 111, but they are not limited thereto. In some embodiments (not shown), the first traces (for example, 113A/113C) may be electrically connected to, for example, the first conductive layer 112 (as shown in FIG. 6). In some embodiments (not shown), the first conductive pattern (112A/112C) or the second conductive pattern (114A/114C) in the first trace (for example, 113A/113C) may be, for example, connected to the first conductive layer 112 (as shown in FIG. 6) and together in the same layer, but it is not limited thereto. For example, the second conductive patterns (114A/114C) in the first traces (for example, 113A/113C) may be, for example, connected to the first conductive layer 112 and together in the same layer, so that the first traces (for example, 113A/ 113C) are electrically connected to the first conductive layer 112, but the present disclosure is not limited thereto.

In some embodiments (not shown), the second traces (for example, 123A) may be electrically connected to, for example, the second conductive layer 122 (as shown in FIG. 6). In some embodiments (not shown), the third conductive pattern 124A or the fourth conductive pattern 122A in the second trace (for example, 123A) may be, for example, electrically connected to the second conductive layer 122 (as shown in FIG. 6) and together in the same layer, but the present disclosure is not limited thereto. For example, the fourth conductive pattern 122A in the second trace (for example, 123A) may be connected to the second conductive layer 122 (shown in FIG. 6) and together in the same layer, so that the second trace (for example, 123A) may be for example, electrically connected to the second conductive layer 122.

Please refer to FIG. 5 and to FIG. 7 together. In some embodiments, the first substrate 111 may extend from the operation region AA to the extended circuit region 141. In some embodiments, the first polarizing element 115 may extend from the operation region AA to the extended circuit region 141. In some embodiments, the second substrate 121 may extend from the operation region AA to the extended circuit region 141. In some embodiments, the second polarizing element 125 may extend from the operation region AA to the extended circuit region 141. In some embodiments, the first conductive line structure CSL1 may extend from the operation region AA to the extended circuit region 141. In some embodiments, the second conductive line structure CSL2 may extend from the operation region AA to the extended circuit region 141. In some embodiments, the panel 101 may include an adhesive material 144 and, for example, the adhesive material 144 may be disposed between the first substrate 111 and the second substrate 121, and disposed in the extended circuit region 141, but the present disclosure is not limited thereto. In some embodiments, the adhesive material 144 may be selectively disposed between the first traces (for example, 113A/113C) and the second traces (for example, 123A). The adhesive material 144 may be used to support the distance between the first substrate 111 and the second substrate 121 in the extended circuit region 141, and to reduce the chances of short circuit due to the contact between the first trace (for example, 113A/113C) and the second trace (for example, 123A), but the present disclosure is not limited thereto. In some embodiments, the adhesive material 144 may reduce the influence of the moisture or of the oxygen in the environment on the first traces (for example, 113A/113C) and on the second trace (for example, 123A), but the present disclosure is not limited thereto. In some embodiments, the adhesive material 144 and the sealing material 130 may be the same or different materials. In some embodiments, the adhesive material 144 and the sealing material 130 may be connected to or separated from each other.

FIG. 8 illustrates a schematic cross-sectional structure view of the electronic device 101A along the line F-F' in the extended circuit region 141 in FIG. 5 according to an embodiment of the present disclosure. In some embodiments, the first conductive line structure CSL1 which is disposed in the extended circuit region 141 of FIG. 8 may further have a first trace 113B, but the present disclosure is not limited thereto. In some embodiments, the first trace 113B may include, for example, a metal material, a transparent conductive material, or a combination of the above. In some embodiments, the first trace 113B is, for example, a single-layer or multi-layer structure. The material of the first trace 113B may be similar to that of the first trace 113A or of the first trace 113C. In details, the first traces 113B may be composed of, for example, the first conductive pattern 112B and/or the second conductive pattern 114B, respectively. It should be noted that, for example, the first trace 113B is not electrically connected to the first conductive layer 112. In some embodiments, the first traces 113B may overlap with the second traces 123A in the normal direction Z of the first substrate 111, for example. In some embodiments, the first trace 113B may be electrically connected to, for example, the second conductive line structure 123 (for example, the second trace 123A). For example, the first trace 113B may be electrically connected to the second conductive line structure 123 (for example, the second trace 123A) via one or more conductive elements 143, for example. In some embodiments, the conductive element 143 may include, gold (Au) paste, silver paste, or other suitable conductive materials, but the present disclosure is not limited thereto. In some embodiments, the panel 101 may include an adhesive material 144, and the adhesive material 144 may cover at least one conductive element 143, for example, to reduce the influence of the moisture or of the oxygen in the environment on the conductive element 143, but the present disclosure is not limited thereto. Please refer to FIG. 5 together with FIG. 8. In some embodiments, the first traces (for example, 113A and 113C) may be, for example, used to transmit a first signal to the first conductive layer 112, the first trace 113B and the second conductive line structure 123 (for example, the second trace 123A) may be used to transmit a second signal to the second conductive layer 122, for example, and the first signal is different from the second signal.

It should be noted that the adhesive material 144 in FIG. 7 or in FIG. 8 may also be applied to the entire surfaces between the first substrate 111 and the second substrate 121, for example, and is not limited to the embodiment of the balls shown in FIG. 7 or in FIG. 8.

FIG. 9 illustrates a schematic cross-sectional structure view of the electronic device 101A along the line H-H' in FIG. 5 according to an embodiment of the present disclosure. FIG. 9 illustrates a schematic cross-sectional structure view of a terminal portion 145 of the extended circuit region 141 of the electronic device 101A according to an embodiment of the present disclosure. In some embodiments, the first conductive line structure CSL1 extends from the operation region AA to the extended circuit region 141, and a portion of the first conductive line structure CSL1 disposed at the terminal portion 145 of the extended circuit region may be exposed by the second substrate 120 and/or the second polarizing element 125. In some embodiments, the electronic element 151 may be electrically connected to a portion of the first conductive line structure CSL1 which is exposed by the second substrate 121 and/or the second polarizing element 125. In some embodiments, a part of the second substrate 121 and/or a part of the second polarizing element 125 which is/are disposed at the terminal portion 145 of the extended circuit region 141 may be removed, so that a portion of the first conductive line structure CSL1 may be exposed. In some embodiments, the method of removing a part of the second substrate 121 and/or a part of the second polarizing element 125 may include laser cutting, wheel cutter, or other suitable removal methods. In some embodiments, the part which is exposed by the second substrate 121 and/or by the second polarizing element 125 may define an outer lead bonding (OLB) 150, so the first trace 113A, the first trace 113B and the first trace 113C in the conductive line structure CSL1 in the outer lead bonding 150 may be used as terminals for receiving the signals which are provided by the electronic device 151, but the present disclosure is not limited thereto. In some embodiments, the electronic component 151 may include one of a connector, a flexible printed circuit (FPC), a chip on film (COF) or an integrated circuit (IC), but the present disclosure is not limited thereto.

FIG. 10 illustrates a schematic side view of an electronic device 102 according to an embodiment of the present disclosure. In one embodiment, the electronic device 102 may include a privacy control panel 102A and/or a display panel 102B (or other panels). In some embodiments, the display panel 102B may include a self-luminous panel or a non-self-luminous panel. If the display panel 102B is a non-self-luminous panel, a backlight module (not shown) may be disposed underneath. The above-mentioned privacy control panel 102A and/or the display panel 102B (or other panels) may be designed to serve as the panel with the extended circuit region 141 of the present disclosure according to requirements.

FIG. 11 illustrates a schematic cross-sectional structure view of the electronic device 103 along the line E-E' in FIG. 5 of a variant embodiment according to an embodiment of the present disclosure. If the electronic device 103 is applied to a self-luminous panel, the panel 103A may include a carrier 127, a conductive line structure CSL3 (which may include a thin film transistor layer) and a plurality of light-emitting elements 129, but the present disclosure is not limited thereto. The light-emitting element 129 may include, for example, a light-emitting diode, a quantum dot, fluorescence, phosphorescence, other suitable display media, or a combination of the above materials, but the present disclosure is not limited thereto. A light-emitting diode may include, for example, an organic light-emitting diode, a sub-millimeter light emitting diode LED), (mini a micro light-emitting diode (micro LED), or a quantum dot light-emitting diode (QLED, QDLED), or other suitable materials, or a combination of the above, but the present disclosure is not limited thereto. In some embodiments, the panel 103A includes the operation region AA and the extended circuit region 141, and the extended circuit region 141 may include the outer lead bonding 150 as described above. In some embodiments, the first substrate 111 extends from the operation region AA to the extended circuit region 141. In some embodiments, the first polarizing element 115 extends from the operation region AA to the extended circuit region 141. In some embodiments, the first conductive line structure CSL1 may be disposed on a surface of the first substrate 111 away from the first polarizing element 115, the first conductive line structure CSL1 extends from the operation region AA to the extended circuit region 141, and a portion of the first conductive line structure CSL1 is exposed by the second substrate 121 and by the carrier 127. In some embodiments, the electronic component (not shown in FIG. 11, so please refer to FIG. 9) may be electrically connected to a portion of the first conductive line structure CSL1 which is exposed by the second substrate 121 and by the carrier 127. In some embodiments (not shown), the conductive line structure CSL3 may be electrically connected to the first conductive line structure CSL1 via some conductive connecting members (not shown, such as copper pillars of silver paste), through the first conductive line structure CSL1 to transmit the signals which are provided by the electronic element, thereby operating the light-emitting element 129, but the present disclosure is not limited thereto. In some embodiments (not shown), the first conductive line structure CSL1 may optionally include a thin film transistor layer, and meanwhile the light-emitting element 129 may be for example electrically connected to or bonded to the first conductive line structure CSL1, so the conductive line structure CSL3 may be optionally omitted.

The electronic devices in various embodiments of the present disclosure may include a panel. The panel may include at least one substrate and at least one polarizing element. The panel may include an operation region and a non-operation region, at least one substrate and at least one polarizing element may extend from the operation region to the extended circuit region, in addition, by extending the first conductive line structure from the operation region to the extended circuit region, and by exposing a portion of the first conductive line structure to serve as a terminal portion for receiving the signals which are provided by the electronic component, thereby replacing the conventional flexible printed circuit board. Through the designs of the present disclosure, the manufacturing process and method of the electronic device may be simplified or the manufacturing cost may be reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
a panel having an operation region and a non-operation region, wherein the non-operation region comprises an extended circuit region, wherein the panel comprises:
    a first substrate;
    a sealing material disposed on the first substrate, wherein the operation region and the non-operation region are defined by the sealing material;
    a first polarizing element disposed on the first substrate, wherein the first substrate extends from the operation region to the extended circuit region, and the first polarizing element extends from the operation region to the extended circuit region;
    a second substrate disposed relative to the first substrate and extending from the operation region to the extended circuit region;
    a second polarizing element disposed on a surface of the second substrate away from the first substrate, and the second polarizing element extending from the operation region to the extended circuit region;
    a first conductive line structure, wherein the first conductive line structure is disposed on a surface of the first substrate away from the first polarizing element, the first conductive line structure extends from the operation region to the extended circuit region, and a portion of the first conductive line structure is exposed by the second substrate and by the second polarizing element; and
    a second conductive line structure disposed on a surface of the second substrate away from the second polarizing element, and the second conductive line structure extends from the operation region to the extended circuit region, wherein a portion of the second conductive line structure disposed between the sealing material and the second substrate.

2. The electronic device according to claim 1, further comprising:
an electronic element electrically connected to the portion of the first conductive line structure exposed by the second substrate and by the second polarizing element.

3. The electronic device according to claim 1, wherein the first conductive line structure has a first trace, the second conductive line structure has a second trace, and the first trace and the second trace are electrically connected to each other via a conductive element.

4. The electronic device according to claim 3, wherein the panel further comprises an adhesive material, and the adhesive material covers the conductive element.

5. The electronic device according to claim 3, wherein the first trace and the second trace overlap in a normal direction of the first substrate.

6. The electronic device according to claim 1, wherein the panel is a privacy control panel.

7. The electronic device according to claim 1, wherein the panel is a display panel.

8. The electronic device according to claim 1, wherein the extended circuit region is in the form of an L-shape or a rectangle shape.

* * * * *